United States Patent
Shibata et al.

(10) Patent No.: US 6,844,611 B2
(45) Date of Patent: Jan. 18, 2005

(54) III NITRIDE EPITAXIAL SUBSTRATE, EPITAXIAL SUBSTRATE FOR III NITRIDE ELEMENT, AND III NITRIDE ELEMENT THAT INCLUDES A SURFACE NITRIDE LAYER FORMED ON THE MAIN SURFACE OF A SAPPHIRE SINGLE CRYSTAL

(75) Inventors: Tomohiko Shibata, Kasugai (JP); Shigeaki Sumiya, Hekinan (JP); Keiichiro Asai, Nagoya (JP); Mitsuhiro Tanaka, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 19 days.

(21) Appl. No.: 10/247,366

(22) Filed: Sep. 20, 2002

(65) Prior Publication Data

US 2003/0170503 A1 Sep. 11, 2003

(30) Foreign Application Priority Data

Sep. 28, 2001 (JP) .................................. 2001-300288
Aug. 28, 2002 (JP) .................................. 2002-249187
Sep. 13, 2002 (JP) .................................. 2002-268349

(51) Int. Cl.$^7$ .......................................... H01L 31/0304
(52) U.S. Cl. ...................................... 257/615; 257/628
(58) Field of Search ................................ 257/615, 628; 438/150, 479; 428/698

(56) References Cited

U.S. PATENT DOCUMENTS

| 6,252,255 B1 | * | 6/2001 | Ueta et al. | 257/94 |
| 6,265,089 B1 | * | 7/2001 | Fatemi et al. | 428/698 |
| 6,593,016 B1 | * | 7/2003 | Chiyo et al. | 428/698 |
| 6,635,904 B2 | * | 10/2003 | Goetz et al. | 257/103 |

FOREIGN PATENT DOCUMENTS

| JP | 2000082676 | 3/2000 |
| JP | 2002176196 | 6/2002 |

* cited by examiner

Primary Examiner—Stephen W. Smoot
(74) Attorney, Agent, or Firm—Oliff & Berridge, PLC

(57) ABSTRACT

The crystal orientation of the main surface of a sapphire single crystal base material to constitute an epitaxial substrate is inclined from the <0001> orientation (c-axis) preferably for the <1–100> orientation (m-axis) by a range within 0.02–0.3 degrees. Then, a surface nitride layer is formed at the main surface of the base material. Then, a III nitride underfilm is formed on the main surface of the base material via the surface nitride layer. The III nitride underfilm includes at least Al element, and the full width at half maximum at (101-2) reflection in X-ray rocking curve of the III nitride underfilm is 2000 seconds. The surface roughness Ra within 5 μm area is 3.5 Å.

13 Claims, 1 Drawing Sheet

III NITRIDE EPITAXIAL SUBSTRATE, EPITAXIAL SUBSTRATE FOR III NITRIDE ELEMENT, AND III NITRIDE ELEMENT THAT INCLUDES A SURFACE NITRIDE LAYER FORMED ON THE MAIN SURFACE OF A SAPPHIRE SINGLE CRYSTAL

BACKGROUND OF THE INVENTION

1. Field of the Invention

This invention relates to a III nitride epitaxial substrate, an epitaxial substrate for III nitride element and a III nitride element, particularly a III nitride epitaxial substrate suitable for a semiconductor nitride element such as a photonic device, an electronic device or a field emitter, a III nitride element such as a photonic device made of the III nitride film epitaxial film, and an epitaxial substrate for the III nitride element.

2. Related Art Statement

III nitride films are used as semiconductor films for light-emitting diodes and electronic devices, and recently get attention as semiconductor films for high speed IC chips. Particularly, Al-including III nitride films get attention as field emitter materials.

Such a III nitride film is formed on an epitaxial substrate, for example, which has an underfilm epitaxially grown on a given base material. A sapphire single crystal is employed as the base material because it is not expensive and easily available.

The underfilm is preferably made of an Al-including III nitride film in order to facilitate the epitaxial growth of the III nitride film to be formed Moreover, since such an Al-including III nitride film has a larger bandgap, if it is formed between a base material and a given III nitride film, it can enhance the efficiency of the resultant semiconductor element.

The epitaxial substrate is set on a susceptor installed in a given reactor, and heated to a predetermined temperature with a heater built in or out of the susceptor. Then, a III metallic supply source, a nitrogen supply source and another element supply source if desired are introduced into the reactor with a carrier gas, and supplied onto the epitaxial substrate to fabricate the III nitride film by an MOCVD method.

In the case of the use of the epitaxial substrate, a large amount of misfit dislocations may be created due to the difference in lattice constant between the sapphire single crystal base material and the Al-including III nitride underfilm, and propagated as penetrating dislocations through the III nitride underfilm to reach the surface of the epitaxial substrate. If the III nitride film is made on the epitaxial substrate, a large amount of dislocations may be created in the III nitride film, originated from the propagated misfit dislocations.

The above-mentioned similar phenomenon can be observed when a Ga-including or another III nitride underfilm as well as the Al-including III nitride underfilm is formed on the sapphire single crystal base material.

In other words, in the case of the use of the sapphire single crystal base material, only a low crystal quality III nitride film including a relatively large amount of dislocations can be formed, so that if a semiconductor light-emitting element is fabricated by utilizing the low crystal quality m nitride film, the luminous efficiency of the semiconductor element is deteriorated. And if a electronic device element such as HEMT, HBT is fabricated by utilizing the low crystal quality III nitride film, electrical mobility goes down or leak electric current increases. As a result, the semiconductor element can not exhibit the inherent performances as designed.

SUMMARY OF THE INVENTION

It is an object of the present invention to provide a new epitaxial substrate having a sapphire single crystal base material and an Al-including III nitride underfilm, whereby a high crystalinity nitride film, particularly an Al-including nitride film, including much less dislocations, can be formed.

In order to achieve the above object, this invention relates to a III nitride epitaxial substrate comprising;

a sapphire single crystal base material of which a crystal orientation of a main surface is inclined from the <0001> orientation by a range within 0.02–0.3 degrees and which includes a surface nitride layer at the main surface, and a III nitride underfilm which is formed on the main surface of the sapphire single crystal base material via the surface nitride layer and includes at least Al element, and of which a full width at half maximum at (10–12) reflection in X-ray rocking curve is 2000 seconds or below and of which a surface roughness Ra within 5 $\mu$m area is 3.5 Å.

The inventors had intensely studied to develop an epitaxial substrate on which the high crystallinity nitride film, particularly the Al-including nitride film, including low dislocation density, can be formed. Then, the inventors had made vast researches and developments about sapphire single crystal base materials to constitute epitaxial substrates. As a result, the inventors found out that the crystallinity and the physical properties of the main surface of the base material on which the nitride film is formed affect eventfully on the creation of dislocation between the sapphire single crystal base material and the Al-including III nitride underfilm, so conceived the present invention.

Since the epitaxial substrate of the present invention can exhibit good crystal quality of low dislocation density, the dislocation density of a III nitride film particularly including Al element to be formed on the epitaxial substrate can be reduced, and thus, the crystal quality can be enhanced.

Such a technique is disclosed in Japanese Patent Application Laid-open No. 2000-82676 as that by inclining the crystal orientation of the main surface of a sapphire single crystal base material from the <0001> orientation by 0.05–0.20 degrees, the dislocation density of a III nitride film formed on the main surface of the base material is reduced. In this case, however, the base material is composed only of a sapphire single crystal, and is employed exclusively for fabricating a semiconductor layer group made of Ga-based nitride films.

However, if a semiconductor layer group particularly made of Al-based nitride films is fabricated on a sapphire single crystal base material as described in the above conventional technique, the dislocation density of the semiconductor layer group can not be reduced. In order to reduce the dislocation densities of the Al-based nitride films, it is required that the main surface of a sapphire single crystal base material is inclined and a surface nitride layer is formed at the main surface of the base material, according to the present invention. Also, it is required that an Al-including nitride film is formed on the main surface of the base material.

If the surface nitride layer is formed according to the present invention, the inclination angle of the main surface of the base material can be increased to a range within 0.05–0.25 degrees, particularly a range within 0.05–0.3 degrees, from a conventional range within 0.05–0.20 degrees. As a result, the selectivity of the sapphire single crystal base material can be increased, and thus, the degree of freedom in design of the resultant semiconductor element can be also increased.

BRIEF DESCRIPTION OF THE DRAWINGS

For better understanding of the present invention, reference is made to the attached drawings, wherein.

DESCRIPTION OF THE PREFERRED EMBODIMENTS

This invention will be described in detail, hereinafter.

It is required in the present invention that the crystal orientation of the main surface of the sapphire single crystal base material to constitute the epitaxial substrate is inclined from the <0001> orientation, that is, the c-axis orientation by a range within 0.02–0.3 degrees, preferably 0.05–0.25 degrees, more preferably 0.07–0.2 degrees. In other words, it is required in the present invention to employ an off-angled sapphire single crystal base material of which the c-face is inclined by the above-mentioned range.

Then, if the surface nitride layer is formed at the main surface of the base material according to the present invention, the dislocation density of an Al-including nitride underfilm to be formed on the main surface of the base material can be reduced, and thus, the dislocation density of the epitaxial substrate can be reduced entirely, concretely to a range of $5 \times 10^{10}/cm^2$ or below, particularly $10^9/cm^2$ or below, more particularly $10^8/cm^2$ or below.

In this case, the full width at half maximum (FWHM) at (10–12) reflection in X-ray rocking curve of the Al-including nitride underfilm can be improved to a range of 2000 seconds or below, particularly 1700 seconds or below, more particularly 1500 seconds or below. In addition, the surface roughness (Ra) of the Al-including nitride underfilm can be reduced to a range of 3.5 Å or below, particularly 2.5 Å or below, particularly 2.0 Å or below per 5 $\mu$m area Therefore, the crystal quality of the Al-including nitride underfilm can be enhanced.

If the inclination angle, that is, the off-angle of the c-faced sapphire single crystal base material is set within the above-mentioned preferable range, the function/effect of the surface nitride layer can be exhibited most effectively, and thus, the dislocation density of the epitaxial substrate can be reduced most effectively.

If the off-angle of the c-faced sapphire single crystal base material is set beyond 0.3 degrees, the surface roughness of the base material is deteriorated due to generation of pits, and thus, the crystal qualities of the Al-including nitride underfilm and a given Al-including nitride film to be formed on the underfilm are also deteriorated, due to the surface roughness of the base material.

It is desired that the inclination direction of the c-faced sapphire single crystal base material is set to the <1–100> orientation, that is, the m-axis orientation. In this case, the function/operation of the surface nitride layer can be exhibited effectively, and the dislocation density of the epitaxial substrate can he reduced sufficiently.

Figure 1:
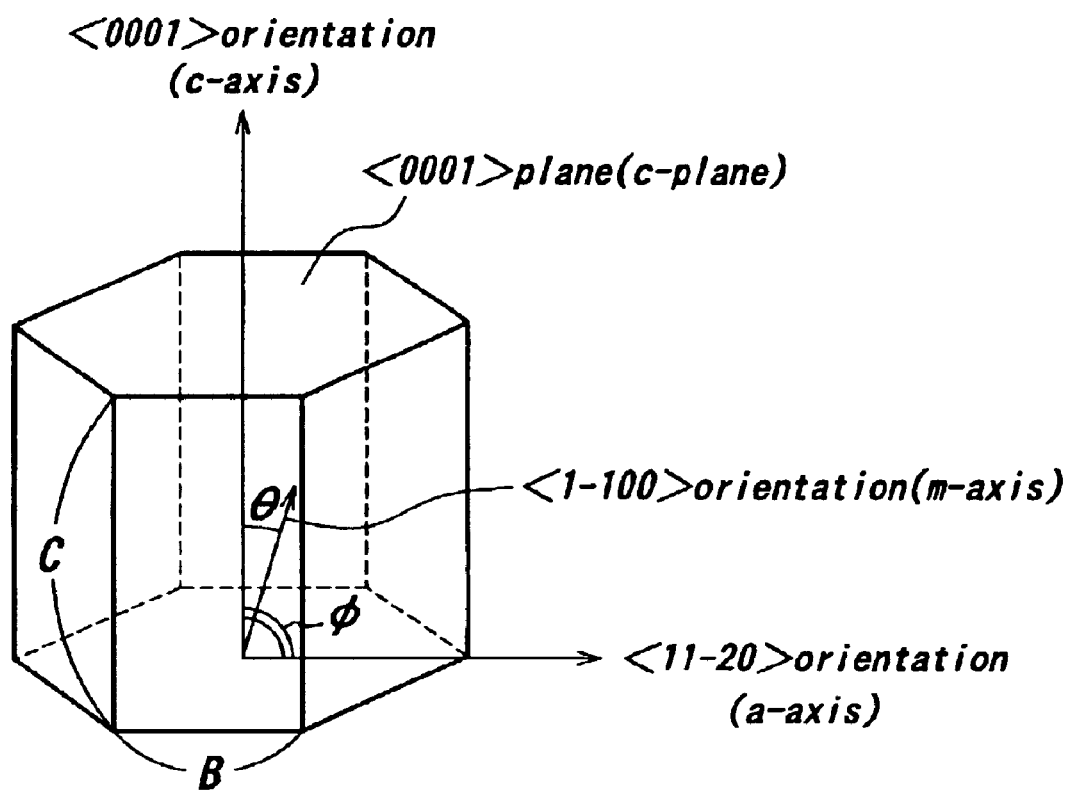
FIG. 1 is a crystal structure of sapphire single crystal.
Figure 1:
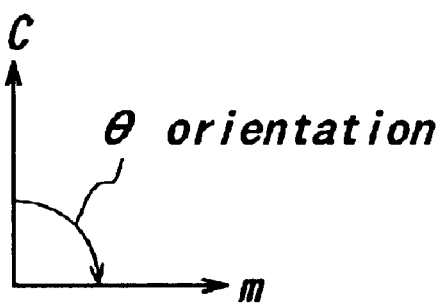

The sapphire single crystal base material has a hexagonal crystal structure as illustrated in FIG. 1, and the c-axis, the m-axis and the a-axis satisfy the physical relationship as illustrated in FIGS. 1. Therefore, the c-axis of the sapphire single crystal base material is preferably inclined to the m-axis by θ angle on FIG. 1.

In the present invention, it is required that the surface nitride layer is formed at the off-angled main surface of the c-faced sapphire single crystal base material. The surface nitride layer is formed thick so that the nitrogen content at a depth of 1 nm from the main surface of the surface nitride layer is preferably set to a range of 2 atomic percentages, more preferably within 5–50 atomic percentages.

Herein, the depth and the nitrogen content are measured from the compositional analysis of the c-faced sapphire single crystal base material in the thickness direction by means of ESCA when the c-faced sapphire single crystal base material is etched in the thickness direction with Ar ions.

Detailed ESCA measuring conditions will be shown as follows. A X-ray having an energy of 1253.6 eV from a Mg target was employed as a X-ray source. The measuring region was set to 1.1 mm$\phi$, and the detection angle was set to 45 degrees. The pass energy was set to 35.75 eV. The existence of nitrogen was determined on N1s spectrum. The measuring degree of vacuum was set to $3 \times 10^{-9}$ Torr. The etching process was carried out by utilizing Ar$^+$ ions having an accelerating voltage of 3.0 kV. The raster region was set to 3 mm×3 mm.

In this case, the etching rate was set to 40 Å/min for $SiO_2$, and the etching rate of $Al_2O_3$ was one-third of that of $SiO_2$. Therefore, the etching rate of the surface nitride layer was conveniently calculated from the $Al_2O_3$ etching rate. That is, the nitrogen content at the depth of 1 nm of the base material is defined by calculating back the etching period for a 1 nm depth of the surface nitride layer from the etching rate of $Al_2O_3$ for the etching rate of the surface nitride layer.

The surface nitride layer can be formed by setting the c-faced sapphire single crystal base material in a nitrogen-including atmosphere, for example in an ammonia atmosphere and heating the base material for a predetermined period. In this case, the nitrogen concentration, the nitriding temperature and the nitriding period are appropriately adjusted.

In the present invention, it is also required that the Al-including III nitride underfilm is formed on the off-angled main surface of the c-faced sapphire single crystal base material via the surface nitride layer. If a III nitride film particularly including Al element is formed on the nitride underfilm, the crystallinity and the dislocation density of the III nitride film can be enhanced. In this point of view, it is desired to develop the crystallinity of the nitride underfilm. Concretely, it is desired that the FWHM at (0002) reflection of the nitride underfilm is improved to a range of 100 seconds or below.

The high crystal quality III nitride film underfilm can be made by means of a MOCVD method where the c-faced sapphire single crystal base material itself is heated at a temperature range of 1100° C. or over, preferably 1250° C. or below.

The III nitride underfilm serves as sort of a buffer layer because it is located between the sapphire single crystal base material and the III nitride film to be formed. Conventionally, in the case of the fabrication of Ga-based nitride films, a low crystallinity AlN or GaN buffer layer is formed by heating a sapphire single crystal base material to a temperature range of 500–600° C. by means of a MOCVD method so as to mitigate the difference in lattice constant between the Ga-based nitride films and the sapphire single crystal base material.

In the present invention, however, even though the high crystallinity III nitride underfilm is formed between the sapphire single crystal base material and III nitride films to be formed, misfit dislocations are not almost created due to the difference in lattice constant therebetween because the sapphire single crystal base material satisfies the above-mentioned requirements Therefore, the crystal quality of the III nitride film can be improved due to the high crystal quality of the III nitride underfilm as mentioned above.

The crystal quality developing tendency of the III nitride film becomes conspicuous as the Al content of the III nitride underfilm increases. In this point of view, the Al content of the III nitride underfilm is preferably set to a range of 50 atomic percentages or over for all of the III elements, and particularly, the III nitride underfilm is preferably made of AlN (Al content of 100 atomic percentages).

The III nitride underfilm may contain B, Si, Ge, Zn, Be, Mg or the like. Moreover, the underfilm may contain inevitable minute element and minute impurities depending on the film-forming condition, the supply source and the reactor material, in addition to the above-mentioned intentional elements.

The thickness of the III nitride underfilm is preferably set to a range of 0.5 $\mu$m or over, particularly within 0.7–3 $\mu$m. Since the sapphire single crystal base material satisfies the above-mentioned requirements of the present invention, no cracks are created and no exfoliation occurs even though the III nitride underfilm is formed thick as mentioned above.

If one or plural III nitride films are formed on the epitaxial substrate fabricated so as to satisfy the above-mentioned requirements of the present invention, a photonic device such as a semiconductor light-emitting element or a semiconductor light-detecting element, an electronic device or a field emitter can be fabricated.

Since the one or plural III nitride films are formed on the epitaxial substrate of the present invention, the crystal quality of low dislocation density and high crystallinity thereof can be realized, so the efficiency of the photonic device or the electron device can be also improved.

Herein, the one or plural III nitride films may be formed by using the same MOCVD apparatus as the one whereby the epitaxial substrate is fabricated. Also, they may be formed by using a different MOCVD apparatus.

EXAMPLES

This invention will be concretely described hereinafter.

Example 1

A c-faced sapphire single crystal base material having a main surface off angled by 0.15 degrees for the m-axis was employed, and then, set and attracted on a susceptor installed in a quartz reactor. Thereafter, the base material was heated to 1200° C. with the heater built in the susceptor.

Then, an ammonia ($NH_3$) gas was supplied with a carrier gas onto the base material to nitride the main surface of the base material. It was turned out from ESCA analysis that a nitride layer was formed at the main surface of the base material by the surface nitriding treatment and the nitrogen content at a depth of 1 nm from the main surface was seven atomic percentages.

Then, a trimethyl aluminum (TMA) as a Al supply source and an $NH_3$ gas as a nitrogen supply source were employed, and introduced with a hydrogen carrier gas into the reactor at a flow rate ratio of $NH_3$/TMA=500 and supplied onto the base material to form an AlN underfilm in a thickness of 1 $\mu$m on the base material. Herein, the flow rates of $NH_3$ and TMA were appropriately controlled on the film-forming rate at the above flow rate ratio.

When the crystallinity of the AlN underfilm was measured by means of X-ray rocking curve analysis ($\omega$-scan), the FWHM at (0002) reflection was about 70 seconds and the FWHM at (10–12) reflection was about 1000 seconds. Therefore, it was turned out that the AlN underfilm has good crystallinity. The surface roughness Ra of the AlN underfilm was 1.5 Å within 5 $\mu$m area, and it was also turned out that the AlN underfilm has good flatness. The dislocation density of the AlN underfilm was $5\times10^9$/$cm^2$.

Then, a trimethyl gallium (TMG) as a Ga supply source was also introduced into the reactor at a flow rate ratio of $NH_3$/(TMA+TMG)=2000 with hydrogen carrier gas and supplied onto the AlN underfilm to form an $Al_{0.1}Ga_{0.9}N$ film in a thickness of 3 $\mu$m. When the dislocation density of the $Al_{0.1}Ga_{0.9}N$ film was measured by means of TEM observation, it was turned out to be $1\times10^8$/$cm^2$.

Example 2

A c-faced sapphire single crystal base material having a main surface off angled by 0.07 degrees for the m-axis was employed. Then, a surface nitriding treatment was carried out in the same manner as in Example 1, and an AlN underfilm was formed in the same manner as in Example 1. When the crystallinity of the AlN underfilm was measured by means of X-ray rocking curve analysis ($\omega$-scan), the FWHM at (0002) reflection was about 70 seconds and the FWHM at (10–12) reflection was about 1300 seconds. The surface roughness Ra of the AlN underfilm was 1.5 Å within 5 $\mu$m area. The dislocation density of the AlN underfilm was $7\times10^9$/$cm^2$.

Then, an $Al_{0.1}Ga_{0.9}N$ film was formed on the AlN underfilm in the same manner as in Example 1. When the dislocation density of the $Al_{0.1}Ga_{0.9}N$ film was measured by means of TEM observation, it was turned out to be $2\times10^8$/$cm^2$.

Example 3

A c-faced sapphire single crystal base material having a main surface off angled by 0.15 degrees for the a-axis was employed. Then, a surface nitriding treatment was carried out in the same manner as in Example 1, and an AlN underfilm was formed in the same manner as in Example 1. When the crystallinity of the AlN underfilm was measured by means of X-ray rocking curve analysis ($\omega$-scan), the FWHM at (0002) reflection was about 70 seconds and the FWHM at (10–12) reflection was about 1300 seconds. The surface roughness Ra of the AlN underfilm was 1.5 Å within 5 $\mu$m area. The dislocation density of the AlN underfilm was $7\times10^9$/$cm^2$.

Then, an $Al_{0.1}Ga_{0.9}N$ film was formed on the AlN underfilm in the same manner as in Example 1. When the dislocation density of the $Al_{0.1}Ga_{0.9}N$ film was measured by means of TEM observation, it was turned out to be $2\times10^8$/$cm^2$.

Example 4

A c-faced sapphire single crystal base material having a main surface off angled by 0.02 degrees for the m-axis was employed. Then, a surface nitriding treatment was carried out in the same manner as in Example 1, and an AlN underfilm was formed in the same manner as in Example 1. When the crystallinity of the AlN underfilm was measured by means of X-ray rocking curve analysis (ω-scan), the FWHM at (0002) reflection was about 70 seconds and the FWHM at (10–12) reflection was about 1800 seconds. The surface roughness Ra of the AlN underfilm was 1.5 Å within 5 μm area. The dislocation density of the AlN underfilm was $3 \times 10^{10}/cm^2$.

Then, an $Al_{0.1}Ga_{0.9}N$ film was formed on the AlN underfilm in the same manner as in Example 1. When the dislocation density of the $Al_{0.1}Ga_{0.9}N$ film was measured by means of TEM observation, it was turned out to be $5 \times 10^8/cm^2$.

Example 5

A c-faced sapphire single crystal base material having a main surface off angled by 0.3 degrees for the m-axis was employed. Then, a surface nitriding treatment was carried out in the same manner as in Example 1, and an AlN underfilm was formed in the same manner as in Example 1. When the crystallinity of the AlN underfilm was measured by means of X-ray rocking curve analysis (ω-scan), the FWHM at (0002) reflection was about 70 seconds and the FWHM at (10–12) reflection was about 1500 seconds. The surface roughness Ra of the AlN underfilm was 3.0 Å within 5 μm area. The dislocation density of the AlN underfilm was $2 \times 10^{10}/cm^2$.

Then, an $Al_{0.1}Ga_{0.9}N$ film was formed on the AlN underfilm in the same manner as in Example 1. When the dislocation density of the $Al_{0.1}Ga_{0.9}N$ film was measured by means of TEM observation, it was turned out to be $5 \times 10^8/cm^2$.

Comparative Example 1

A c-faced sapphire single crystal base material having a main surface off angled by 0.15 degrees for the m-axis was employed. Then, an AlN underfilm was formed directly on the base material in the same manner as in Example 1 without a surface nitriding treatment. When the crystallinity of the AlN underfilm was measured by means of X-ray rocking curve analysis (ω-scan), the FWHM at (0002) reflection was about 250 seconds and the FWHM at (10–12) reflection was about 1800 seconds. The surface roughness Ra of the AlN underfilm was 1.5 Å within 5 μm area. The dislocation density of the AlN underfilm was $3 \times 10^{10}/cm^2$.

Then, an $Al_{0.1}Ga_{0.9}N$ film was formed on the AlN underfilm in the same manner as in Example 1. When the dislocation density of the $Al_{0.1}Ga_{0.9}N$ film was measured by means of TEM observation, it was turned out to be $8 \times 10^9 cm^2$.

Comparative Example 2

A c-faced sapphire single crystal base material having a main surface off angled by 0.4 degrees for the m-axis was employed. Then, a surface nitriding treatment was carried out in the same manner as in Example 1, and an AlN underfilm was formed in the same manner as in Example 1. When the crystallinity of the AlN underfilm was measured by means of X-ray rocking curve analysis (ω-scan), the FWHM at (0002) reflection was about 70 seconds and the FWHM at (10–12) reflection was about 1500 seconds. The surface roughness Ra of the AlN underfilm was 4.0 Å within 5 μm area, and many pits and step bunchings were observed in the AlN underfilm. The dislocation density of the AlN underfilm was $7 \times 10^{10}/cm^2$.

Then, an $Al_{0.1}Ga_{0.9}N$ film was formed on the AlN underfilm in the same manner as in Example 1. When the dislocation density of the $Al_{0.1}Ga_{0.9}N$ film was measured by means of TEM observation, it was turned out to be $8 \times 10^9 cm^2$.

Comparative Example 3

A c-faced sapphire single crystal base material having a main surface off angled by 0.01 degrees or below for the m-axis was employed. Then, a surface nitriding treatment was carried out in the same manner as in Example 1, and an AlN underfilm was formed in the same manner as in Example 1. When the crystallinity of the AlN underfilm was measured by means of X-ray rocking curve analysis (ω-scan), the FWHM at (0002) reflection was about 70 seconds and the FWHM at (10–12) reflection was about 2500 seconds. The surface roughness Ra of the AlN underfilm was 1.5 Å within 5 μm area, and pits were observed in the AlN underfilm. The dislocation density of the AlN underfilm was $5 \times 10^{10}/cm^2$.

Then, an $Al_{0.1}Ga_{0.9}N$ film was formed on the AlN underfilm in the same manner as in Example 1. When the dislocation density of the $Al_{0.1}Ga_{0.9}N$ film was measured by means of TEM observation, it was turned out to be $1 \times 10^{10}/cm^2$.

As is apparent from Examples and Comparative Examples, the crystal quality of crystallinity and dislocation density and the surface flatness of the AlN underfilm to constitute an epitaxial substrate according to the present invention are improved. Therefore, the crystal quality of dislocation density of the $Al_{0.1}Ga_{0.9}N$ film is also realized.

As is apparent from Examples 1–3, if the inclination angle of the c-faced sapphire single crystal base material, that is, the off-angle of the main surface of the base material is set within 0.07–0.2 degrees, the crystallinity and the dislocation density of the AlN underfilm is much improved, and thus, the dislocation density of the $Al_{0.1}Ga_{0.9}N$ film is much reduced.

Similarly, as is apparent from Examples 1 and 3, if the c-faced sapphire single crystal base material is inclined for the m-axis, not a-axis, the crystallinity and the dislocation density of the AlN underfilm is much improved, and thus, the dislocation density of the $Al_{0.1}Ga_{0.9}N$ film is much reduced.

Although the present invention was described in detail with reference to the above examples, this invention is not limited to the above disclosure and every kind of variation and modification may be made without departing from the scope of the present invention. For example, a buffer layer or a multi-layered structure such as a distorted superstructure may be provided between the epitaxial substrate and an Al-including nitride film to be formed. In this case, the crystallinity of the Al-including nitride film can be improved.

As mentioned above, a sapphire single crystal base material and a new epitaxial substrate including the sapphire single crystal base material, whereby a nitride film having high crystal quality can be formed, can be provided.

What is claimed is:

1. A III nitride epitaxial substrate comprising;
    a sapphire single crystal base material of which a crystal orientation of a main surface is inclined from the <0001> orientation by a range within 0.02–0.3 degrees and which includes a surface nitride layer at said main surface, and
    an III nitride underfilm which is formed on said main surface of said sapphire single crystal base material via said surface nitride layer and includes at least Al element, and of which a full width at half maximum at (10–12) reflection in X-ray rocking curve is 2000 seconds or below and of which a surface roughness Ra within 5 μm area is 3.5 Å, wherein the thickness of the m nitride underfilm is 0.5 μm or greater.

2. The III nitride epitaxial substrate as defined in claim 1, wherein said crystal orientation of said main surface of said sapphire single crystal base material is inclined from <0001> orientation by a range within 0.05–0.25 degrees.

3. The III nitride epitaxial substrate as defined in claim 2, wherein said crystal orientation of said main surface of said sapphire single crystal base material is inclined from <0001> orientation by a range within 0.07–0.20 degrees.

4. The III nitride epitaxial substrate as defined in claim 1, wherein said crystal orientation of said main surface of said sapphire single crystal base material is inclined from <0001> orientation for the <1–100> orientation.

5. The III nitride epitaxial substrate as defined in claim 1, wherein said full width at half maximum at (10–12) reflection in X-ray rocking curve of said III nitride underfilm is 1700 seconds or below and said surface roughness Ra within 5 μm area of said III nitride underfilm is 2.5 Å.

6. The III nitride epitaxial substrate as defined in claim 5, wherein said full width at half maximum at (10–12) reflection in X-ray rocking curve of said III nitride underfilm is 1500 seconds or below and said surface roughness Ra within 5 μm area of said III nitride underfilm is 2.0 Å.

7. The III nitride epitaxial substrate as defined in claim 1, wherein the nitrogen content of said surface nitride layer is set to a range of 2 atomic percentages or over at a depth of 1 nm from said main surface of said sapphire single crystal base material.

8. The III nitride epitaxial substrate as defined in claim 7, wherein the nitrogen content of said surface nitride layer is set to a range within 2–50 atomic percentages at a depth of 1 mm from said main surface of said sapphire single crystal base material.

9. The III nitride epitaxial substrate as defined in claim 1, wherein a full width at half maximum at (0002) reflection in X-ray rocking curve of said III nitride underfilm is 100 seconds or below.

10. The III nitride epitaxial substrate as defined in claim 1, wherein the Al content of said III nitride under film is set to a range of 50 atomic percentages or over for all of the III elements.

11. The III nitride epitaxial substrate as defined in claim 10, wherein said III nitride underfilm is made of AlN.

12. An epitaxial substrate for III nitride element comprising a III nitride epitaxial substrate as defined in claim 1.

13. A III nitride element comprising a III nitride epitaxial substrate as defined in claim 1.

* * * * *